United States Patent [19]
Suenaga

[11] Patent Number: 5,325,074
[45] Date of Patent: Jun. 28, 1994

[54] OSCILLATOR WITH SUPPLY VOLTAGE CHANGEOVER ACCORDING TO ACTIVATED AND DISABLED STATES OF A MICROCOMPUTER

[75] Inventor: Yoshiaki Suenaga, Kyoto, Japan
[73] Assignee: Rohm Co., Ltd., Kyoto, Japan
[21] Appl. No.: 967,621
[22] Filed: Oct. 29, 1992
[30] Foreign Application Priority Data Oct. 29, 1991 [JP] Japan .................. 3-311825

[51] Int. Cl.⁵ .......................... H03B 5/36; H03L 3/00
[52] U.S. Cl. ............................. 331/46; 331/116 FE; 331/158; 331/186; 364/934; 364/DIG. 2; 368/159; 368/204; 395/550; 395/750
[58] Field of Search ............. 331/46, 116 FE, 116 R, 331/158, 185, 186; 368/156, 159, 204; 364/934-934.4; 395/550, 750

[56] References Cited
U.S. PATENT DOCUMENTS

| | | |
|---|---|---|
| 4,641,109 | 2/1987 | Yokouchi ............ 331/116 FE |
| 5,126,695 | 6/1992 | Abe ................. 331/185 X |
| 5,155,453 | 10/1992 | Ruetz ............... 331/116 FE |

FOREIGN PATENT DOCUMENTS

2-222307 9/1990 Japan ................. 331/116 FE

*Primary Examiner*—Siegfried H. Grimm
*Attorney, Agent, or Firm*—Nikaido, Marmelstein, Murray & Oram

[57] ABSTRACT

A microcomputer in which an oscillating circuit provided therein is activated both when the microcomputer is in an activated state and when it is in a disabled state is provided with a changeover circuit for changing over a supply voltage of the oscillating circuit between when the microcomputer is in the activated state and in the disabled state. The changeover circuit supplies to the oscillating circuit a high voltage when the microcomputer is in the activated state and a low voltage when the microcomputer is in the disabled state. As a result, the starting characteristic when the power is turned on is not deteriorated. Further, the power consumption of the oscillating circuit when the microcomputer is in the disabled state is reduced.

2 Claims, 3 Drawing Sheets

OSCILLATOR WITH SUPPLY VOLTAGE CHANGEOVER ACCORDING TO ACTIVATED AND DISABLED STATES OF A MICROCOMPUTER

BACKGROUND OF THE INVENTION

1. Field of the Invention

The present invention relates to an integrated circuit apparatus, and more particularly to an integrated circuit apparatus provided with an oscillating circuit.

2. Description of the Prior Art

Some microcomputers have a time counting function. In such a microcomputer, it is required to activate an oscillating circuit provided therein to perform the time counting function and to display the time even while a central processing unit (CPU) is performing its original operations. In a microcomputer of a type not having the time counting function, a battery used as a power source normally lasts long since the power is hardly consumed when the CPU is in a disabled state. In a microcomputer of the type having the time counting function, however, the life of the battery is unavoidably shortened since an oscillating circuit provided therein is always activated. For this reason, it has been attempted to find a way to minimize the power consumption when the CPU is in the disabled state.

In a prior art shown in FIG. 1, an oscillating circuit 2 formed in a microcomputer 1 has a p-channel metal oxide semiconductor (MOS) transistor 4 and an n-channel MOS transistor 5 which are of CMOS (complementary metal oxide semiconductor) connection. The source of the p-channel MOS transistor 4 is connected through a resistor 6 to a power supply line 8 and the source of the n-channel MOS transistor 7 is connected through a resistor 5 to ground. With this connection, the electric current is limited by the resistors 6 and 7. As a result, power consumption is restrained. In FIG. 1, numeral 3 is an externally-attached quartz resonator, while numerals 9 and 10 are externally-attached capacitors. An oscillation output is transmitted through a line 11 to a predetermined circuit.

In an oscillating circuit using such a current limiting resistor, since power consumption reduction is limited, no satisfactory results are obtained. This is because the values of the resistors 6 and 7 can only be approximately 100kΩ since, if the values of the resistors 6 and 7 are increased, the starting characteristic of the oscillating circuit obtained when the power is turned on is deteriorated. If a resistor value is increased, the current which flows through the circuit will not sufficiently be small in a circuit having a high supply voltage.

SUMMARY OF THE INVENTION

An object of the present invention is to provide an integrated circuit where the power consumed by an oscillating circuit when the integrated circuit is in the disabled state is reduced without the starting characteristic of the oscillating circuit obtained when the power is turned on being deteriorated.

To achieve the above-mentioned object, according to the present invention, an integrated circuit apparatus where an oscillating circuit provided therein is activated both when the integrated circuit apparatus is in an activated state and when it is in the disabled state is provided with changeover means for changing over a supply voltage of the oscillating circuit between when the integrated circuit is in an activated state and when it is in the disabled state.

By providing the changeover means for changing over a supply voltage of the oscillating circuit between when the integrated circuit apparatus is in the activate state and when it is in the, disabled state as described above, the supply voltage of the oscillating circuit can be set to be high when the integrated circuit is in the activated state and the supply voltage of the oscillating circuit can be set to be low when the integrated circuit is in the disabled state. As a result, the starting characteristic of the oscillating circuit obtained at the time of activation of the integrated circuit is excellent. Further, the power consumed by the oscillating circuit when the integrated circuit is in the disabled state is reduced.

BRIEF DESCRIPTION OF THE DRAWINGS

This and other objects and feature of this invention will become clear from the following description, taken in conjunction with the preferred embodiments with reference to the accompanied drawings in which.

DESCRIPTION OF THE PREFERRED EMBODIMENTS

Figure 1:
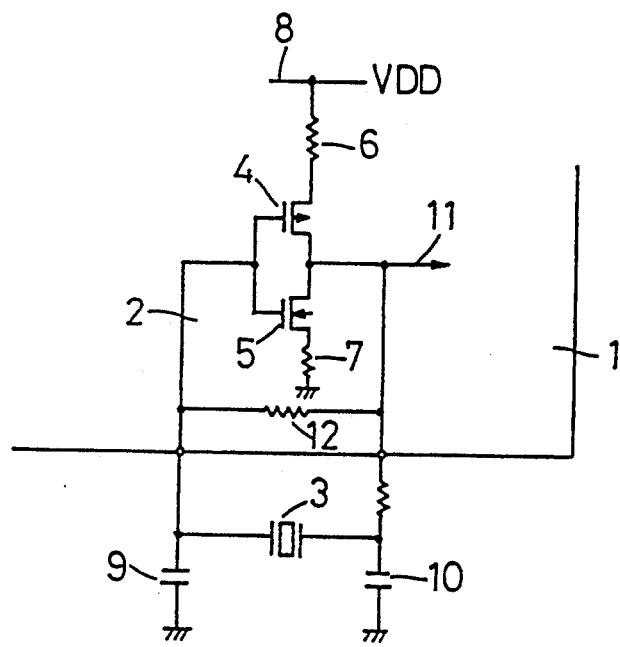
FIG. 1 is a circuit diagram showing an oscillating circuit for use in a conventional integrated circuit apparatus.
Figure 2:
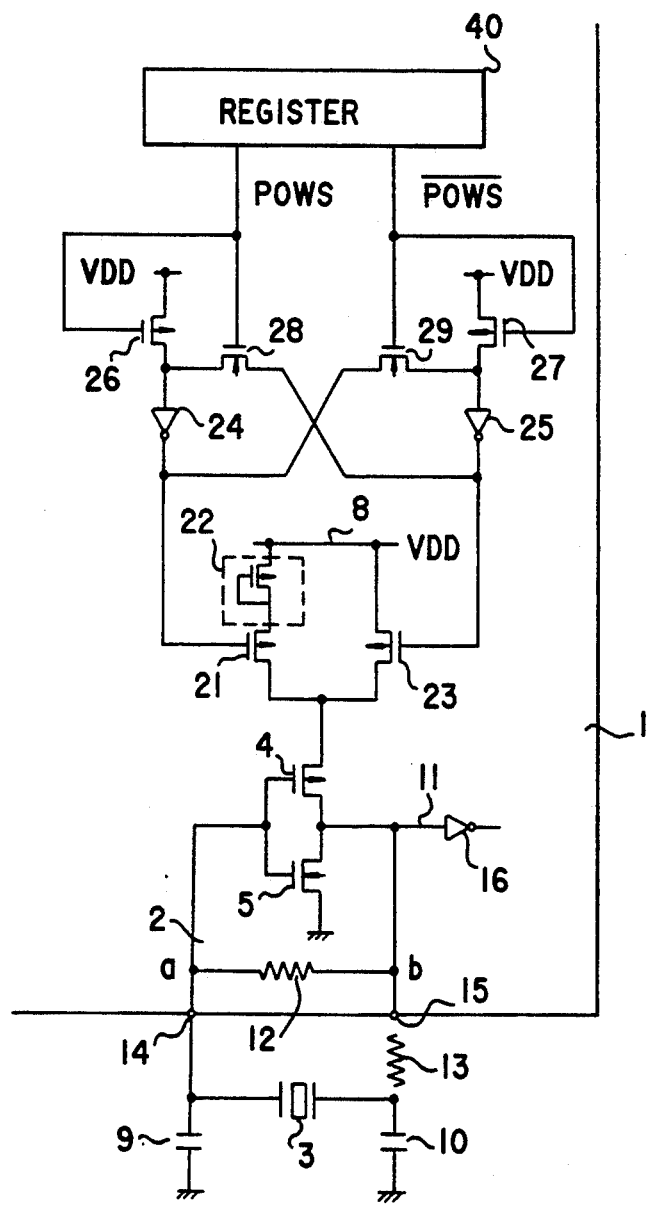
FIG. 2 is a circuit diagram showing an oscillating circuit for use in an integrated circuit apparatus embodying the present invention.

In FIG. 2 showing an embodiment of the present invention, numeral 1 is a microcomputer, and numeral 2 is an oscillating circuit including a p-channel MOS transistor 4 and an n-channel MOS transistor 5 which are of CMOS connection. The source of the n-channel MOS transistor 5 is directly connected to ground. A junction b of the drain of the transistor 4 and the drain of the transistor 5 is connected through a feedback resistor 12 to a gate-side input a. To a terminal pin 14 of the microcomputer 1, one terminal of a capacitor 9 and one terminal of a quartz resonator 3 are connected. The other terminal of the capacitor 9 is connected to ground, while the other terminal of the quartz resonator 3 is connected to one terminal of a capacitor 10. The other terminal of the capacitor 10 is connected to ground. To a terminal pin 15, one terminal of an output resistor 13 is connected. The other terminal of the output resistor 13 is connected to the capacitor 10 and the quartz resonator 3. An oscillation output is transmitted through a line 11 to a predetermined circuit provided in the microcomputer 1. Numeral 16 is a buffer.

In this embodiment, two paths are provided to connect the oscillating circuit 2 to a power supply line 8. One path is a series circuit consisting of a switch transistor 21 and a resistor transistor 22. The other is a switch transistor 23. The switch transistors 21 and 23 are not simultaneously activated; only either of them is activated.

The gate of the transistor 21 is connected to an inverter 24 and the source of an n-channel MOS transistor 29. The gate of the transistor 23 is connected to an inverter 25 and the source of an n-channel MOS transistor 28. The input side of the inverter 24 is connected to the drain of a p-channel MOS transistor 26 and the drain of the n-channel MOS transistor 28. The source of the transistor 26 is connected to a line of a supply voltage VDD. The input side of the inverter 25 is connected to the drain of a p-channel MOS transistor 27 and the drain of the n-channel MOS transistor 29. The source of the transistor 27 is connected to the line of the supply voltage VDD Numeral 40 is a register included in the microcomputer 1 A power saving signal POWS from the register 40 is applied to the gates of the transistors 26 and 28, and a power saving signal $\overline{POWS}$ therefrom is applied to the gates of the transistors 27 and 29. Instead of the saving signals from the register 40, power saving signals from a register which is a RAN (random access memory) (not shown) may be used.

In a disabled state where the microcomputer 1 stops performing its original operations, the p-channel MOS transistor 26 is ON and the n-channel MOS transistor 28 is OFF. This is because the power saving signal POWS (low level) is provided to the transistors 26 and 28 from the register 40.

The p-channel MOS transistor 27 and the n-channel MOS transistor 29 to which the inverted signal $\overline{POWS}$ of the signal POWS is provided is OFF and ON, respectively. Consequently, a low-level signal is provided from the inverter 24 to the gate of the switch transistor 21 of the p-channel MOS to activate the transistor 21, while a high-level signal is provided from the inverter 25 to the gate of the switch transistor 23 of the p-channel MOS to disable the transistor 23. As described above, the path including the switch transistor 21 is activated when the microcomputer 1 is in the disabled state, so that the supply voltage of the oscillating circuit 2 decreases due to a voltage drop caused by the diode-connected resistor transistor 22. Thereby, the power consumed by the oscillating circuit 2 when the microcomputer is in the disabled state is reduced. As a result, the life of a power source battery is extended.

While the microcomputer 1 is performing its original operations, the voltages to be applied to the gates of the transistors 26, 27, 28 and 29 are all inverted to thereby activate the path including the switch transistor 23. Consequently, the supply voltage VDD of the power supply line 8 is directly applied as the supply voltage of the oscillating circuit 2. When a new battery is attached, the path including the switch transistor 23 is activated. Consequently, the supply voltage VDD is directly applied to the oscillating circuit 2. By increasing the supply voltage of the oscillating circuit 2 when the microcomputer is operating, the deterioration of the starting characteristic when the battery is attached is prevented.

Figure 3:
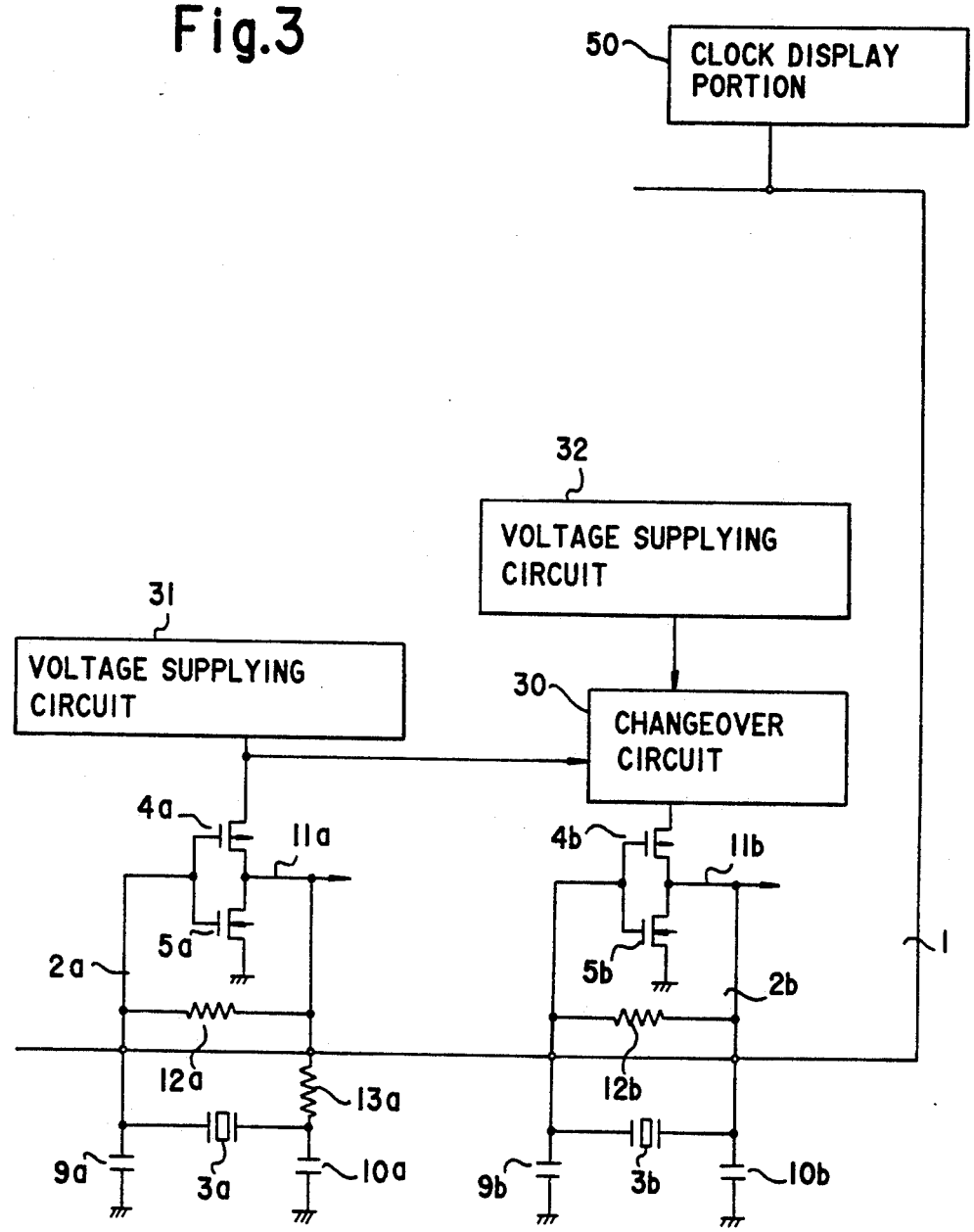
FIG. 3 is a circuit diagram showing another embodiment of the present invention.

FIG. 3 shows an embodiment where a microcomputer 1 is provided with a first oscillating circuit 2a for main operation and a second oscillating circuit 2b for time counting. The first oscillating circuit 2a has a high oscillating frequency, while the second oscillating circuit 2b is activated at a low oscillating frequency of 32kHz. When the microcomputer 1 is in the disabled state although the first oscillating circuit 2a is disabled, the second oscillating circuit 2b remains ON. In that case, a low voltage is provided as the supply voltage of the second oscillating circuit 2b from a voltage supplying circuit 32 through a changeover circuit 30. When the microcomputer 1 is in an activated state, a high voltage is provided from the voltage supplying circuit 31 to the second oscillating circuit as well as to the first oscillating circuit 2a.

In FIG. 3, the same circuit devices as those of FIG. 2 are denoted by the same reference designations accompanied by a subscript a or b.

In FIG. 3, the first oscillating circuit 2a, which operates to perform original operations of the microcomputer 1, is disabled when the microcomputer 1 is in the disabled state, while the second oscillating circuit 2b for time counting is not disabled but only its supply voltage is reduced when the microcomputer 1 is in the disabled state. Consequently, the starting characteristic of the second oscillating circuit 2b obtained when a battery is attached to an electronic apparatus incorporating the microcomputer 1 is excellent, since the second oscillating circuit 2b as well as the first oscillating circuit 2a is activated at a high supply voltage. As a result, the time is displayed in a clock display portion 50 immediately after the battery is attached. Thus, no time lag is caused concerning the display. The clock display portion 50 operates in response to an oscillation output of the second oscillating circuit 2b.

Obviously, many modifications and variations of the present invention are possible in light of the above teachings. It is therefore to be understood that within the scope of the appended claims, the invention may be practiced other than as specifically described.

What is claimed is:

1. An integrated circuit apparatus which is a microcomputer comprising:
    a first oscillating circuit which generates a clock for main operation;
    a second oscillating circuit which generates a clock for time counting; and
    voltage changeover means for increasing an operation voltage of the second oscillating circuit while the first oscillating circuit is operating and for decreasing the operation voltage of the second oscillating circuit while the first oscillating circuit is not operating.

2. An integrated circuit apparatus according to claim 1, comprising a function to control time display based on an output of the second oscillating circuit.

* * * * *